(12) United States Patent
Jia et al.

(10) Patent No.: US 11,545,529 B2
(45) Date of Patent: Jan. 3, 2023

(54) ORGANIC LIGHT EMITTING DIODE (OLED) SUBSTRATE AND MANUFACTURING METHOD THEREOF, DISPLAY DEVICE

(71) Applicant: BOE TECHNOLOGY GROUP CO., LTD., Beijing (CN)

(72) Inventors: Congcong Jia, Beijing (CN); Ziyu Zhang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 177 days.

(21) Appl. No.: 16/757,908

(22) PCT Filed: May 24, 2019

(86) PCT No.: PCT/CN2019/088326
§ 371 (c)(1),
(2) Date: Apr. 21, 2020

(87) PCT Pub. No.: WO2019/228259
PCT Pub. Date: Dec. 5, 2019

(65) Prior Publication Data
US 2020/0343322 A1 Oct. 29, 2020

(30) Foreign Application Priority Data

May 31, 2018 (CN) .......................... 201810550103.3

(51) Int. Cl.
*H01L 27/32* (2006.01)
*H01L 51/56* (2006.01)

(52) U.S. Cl.
CPC ...... *H01L 27/3246* (2013.01); *H01L 27/3211* (2013.01); *H01L 51/56* (2013.01); *H01L 2227/323* (2013.01)

(58) Field of Classification Search
CPC . H01L 27/3246; H01L 27/3211; H01L 51/56; H01L 2227/323
(Continued)

(56) References Cited

U.S. PATENT DOCUMENTS

| 10,062,846 B2 | 8/2018 | Mimura et al. |
| 2008/0211399 A1 | 9/2008 | Ryuji et al. |

(Continued)

FOREIGN PATENT DOCUMENTS

| CN | 101154792 A | 4/2008 |
| CN | 101819988 A | 9/2010 |

(Continued)

OTHER PUBLICATIONS

First Office Action dated Aug. 9, 2019, for corresponding Chinese application 201810550103.3.
(Continued)

*Primary Examiner* — Dzung Tran
(74) *Attorney, Agent, or Firm* — Nath, Goldberg & Meyer; Joshua B. Goldberg

(57) ABSTRACT

The present disclosure provides an organic light emitting diode (OLED) substrate and a manufacturing method thereof, and a display device. The OLED substrate includes: a base substrate; a pixel defining layer on the base substrate, the pixel defining layer including pixel defining patterns for defining sub-pixel units, each sub-pixel unit being defined between adjacent two of the pixel defining patterns; and an organic light emitting layer on a side of the pixel defining layer away from the base substrate, the organic light emitting layer including a first portion in each sub-pixel unit and a second portion on each pixel defining pattern. Each pixel defining pattern is provided with a groove structure therein, and part of the second portion of the organic light emitting layer in the groove structure and the other part of the second (Continued)

portion of the organic light emitting layer are spaced apart from each other.

13 Claims, 12 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2014/0103385 A1* | 4/2014 | Hatano | H01L 33/005 438/28 |
| 2016/0181331 A1* | 6/2016 | Li | H01L 51/5221 438/34 |
| 2016/0343779 A1* | 11/2016 | Zhang | H01L 51/5221 |
| 2018/0061907 A1* | 3/2018 | Kim | H01L 51/5237 |
| 2019/0156740 A1* | 5/2019 | Xu | H01L 51/56 |
| 2019/0157601 A1* | 5/2019 | Hou | H01L 51/5092 |

FOREIGN PATENT DOCUMENTS

| | | |
|---|---|---|
| CN | 102367165 A | 3/2012 |
| CN | 103311265 A | 9/2013 |
| CN | 103367391 A | 10/2013 |
| CN | 103715315 A | 4/2014 |
| CN | 105185876 A | 12/2015 |
| CN | 105226080 A | 1/2016 |
| CN | 105489631 A | 4/2016 |
| CN | 107068721 A | 8/2017 |
| CN | 107359263 A | 11/2017 |
| CN | 108717942 A | 10/2018 |
| CN | 208157413 U | 11/2018 |
| JP | 2000012904 A | 1/2000 |

OTHER PUBLICATIONS

Second Office Action dated Feb. 25, 2020, for corresponding Chinese application 201810550103.3.

Third Office Action dated Aug. 27, 2020, for corresponding Chinese application 201810550103.3.

* cited by examiner

ORGANIC LIGHT EMITTING DIODE (OLED) SUBSTRATE AND MANUFACTURING METHOD THEREOF, DISPLAY DEVICE

CROSS-REFERENCE TO RELATED APPLICATION

This is a National Phase Application filed under 35 U.S.C. 371 as a national stage of PCT/CN2019/088326, filed on May 24, 2019, an application claiming priority to Chinese patent application No. 201810550103.3 filed on May 31, 2018, the disclosure of which is incorporated herein by reference.

TECHNICAL FIELD

The present disclosure relates to an organic light emitting diode (OLED) substrate and a manufacturing method thereof, and a display device.

BACKGROUND

Organic light emitting diodes (OLEDs) have unique characteristics of self-luminescence, fast response, rich color, wide viewing angle, and capability of being fabricated on flexible substrates, and displays based on OLEDs are becoming the mainstream in the display field.

A pixel defining layer is typically fabricated on an OLED substrate to define and separate individual sub-pixel units, and the OLED substrate typically includes organic light emitting devices, whose functional layers and cathodes typically cover the entire surface of the OLED substrate.

SUMMARY

Embodiments of the present disclosure provide an organic light emitting diode (OLED) substrate including: a base substrate; a pixel defining layer on the base substrate, the pixel defining layer including a plurality of pixel defining patterns for defining a plurality of sub-pixel units, each of the plurality of sub-pixel units being defined between adjacent two of the plurality of pixel defining patterns; and an organic light emitting layer on a side of the pixel defining layer away from the base substrate, the organic light emitting layer including a first portion in each of the sub-pixel units and a second portion on each pixel defining pattern. Each pixel defining pattern is provided with a groove structure therein, and part of the second portion of the organic light emitting layer in the groove structure and the other part of the second portion of the organic light emitting layer are spaced apart from each other.

In some embodiments, the groove structure has a depth in a range of 1.0 micrometer to 1.5 micrometers.

In some embodiments, the groove structure has a width in a range of 4.0 micrometers to 6.0 micrometers.

In some embodiments, an included angle between a bottom wall and a side wall of the groove structure is less than or equal to 90 degrees.

In some embodiments, a cross-section of the groove structure in a plane perpendicular to the base substrate and perpendicular to an extending direction of the groove structure has an arc shape, and an arc angle of the arc shape is greater than 180 degrees.

In some embodiments, the OLED substrate further includes a thin film pattern that is on a side of an edge area of each pixel defining pattern away from the base substrate, extends from the edge area to an area where the groove structure of the pixel defining pattern is located and covers a portion of an opening of the groove structure, the edge area being an area of the pixel defining pattern except the area where the groove structure is located, and the thin film pattern is on a side of the second portion of the organic light emitting layer close to the base substrate.

In some embodiments, the first portion of the organic light emitting layer extends to the area where the groove structure of the pixel defining pattern is located, and covers the portion of the opening of the groove structure.

In some embodiments, the edge area of the pixel defining pattern at both sides of the groove structure is provided with the thin film pattern, and the thin film pattern at both sides of the groove structure each cover a portion of the opening of the groove structure.

In some embodiments, the OLED substrate further includes a plurality of first electrodes, each of the plurality of sub-pixel units is provided with a respective one of the plurality of first electrodes therein, and the plurality of first electrodes is on a side of the organic light emitting layer close to the base substrate.

In some embodiments, the groove structure is provided with a filling layer therein, and a height of an upper surface of the filling layer relative to an upper surface of the base substrate is equal to a height of an upper surface of the first portion of the organic light emitting layer relative to the upper surface of the base substrate.

In some embodiments, the OLED substrate further includes a second electrode on a side of the filling layer and the organic light emitting layer away from the base substrate and covering the filling layer and the organic light emitting layer.

In some embodiments, the sub-pixel units include at least one of red sub-pixels, green sub-pixels, and blue sub-pixels.

In some embodiments, the organic light emitting layer includes a hole injection layer, a hole transport layer, an electron barrier layer, a hole barrier layer, an electron transport layer, and an electron injection layer.

The embodiments of the present disclosure provide a display device including the OLED substrate as described above.

The embodiments of the present disclosure provide a manufacturing method of an organic light emitting diode (OLED) substrate, including: providing a base substrate; forming a pixel defining layer on the base substrate, the pixel defining layer including a plurality of pixel defining patterns for defining a plurality of sub-pixel units, each of the plurality of sub-pixel units being defined between adjacent two of the plurality of pixel defining patterns; forming a groove structure in each pixel defining pattern; and forming an organic light emitting layer on a side of the pixel defining pattern away from the base substrate, the organic light emitting layer including a first portion in each of the sub-pixel units and a second portion on each pixel defining pattern, part of the second portion of the organic light emitting layer in the groove structure and the other part of the second portion of the organic light emitting layer being spaced apart from each other.

In some embodiments, the manufacturing method further includes: forming a plurality of first electrodes, each of the plurality of first electrodes being in a corresponding one of the plurality of sub-pixel units, the plurality of first electrodes being formed on a side of the organic light emitting layer close to the base substrate.

In some embodiments, the manufacturing method further includes: forming a filling layer in the groove structure, a height of an upper surface of the filling layer relative to an upper surface of the base substrate being equal to a height of an upper surface of the first portion of the organic light emitting layer relative to the upper surface of the base substrate.

In some embodiments, the manufacturing method further includes: forming a second electrode on a side of the organic light emitting layer away from the base substrate. the second electrode covering the filling layer and the organic light emitting layer.

In some embodiments, the filling layer is formed by an inkjet printing.

In some embodiments, the manufacturing method further includes:

forming a thin film pattern on a side of an edge area of each pixel defining pattern away from the base substrate. the thin film pattern extending from the edge area to an area where the groove structure of the pixel defining pattern is located, and covering a portion of an opening of the groove structure, the edge area being an area of the pixel defining pattern except the area where the groove structure is located, the thin film pattern being on a side of the second portion of the organic light emitting layer close to the base substrate.

DETAILED DESCRIPTION

In order to make those skilled in the art better understand the technical solutions of the present disclosure, an OLED substrate and a manufacturing method thereof and a display device according to the present disclosure will be described in detail below with reference to the accompanying drawings.

At present, in the manufacturing process of an organic light emitting diode device, a mask plate is not directly attached to and in contact with an OLED substrate above the mask plate in an evaporation process, so a certain distance is present between the mask plate and the OLED substrate. During the evaporation, since the organic material is evaporated from bottom to top, the area of the organic material evaporated on the OLED substrate is often larger than the area of the opening of the mask plate, and the excess area of the organic material actually evaporated on the OLED substrate is called a shadow. When the alignment error between the OLED substrate and the mask plate occurs, it is liable to cause shadow overlapping between evaporated electroluminescent layers in adjacent sub-pixel units, and even cause a phenomenon that a shadow of one of the electroluminescent layers in the adjacent sub-pixel units is on the other electroluminescent layer, and as a result, display crosstalk between the adjacent sub-pixels occurs easily.

Meanwhile, due to the above phenomenon, when a certain electroluminescent layer is controlled to emit light at a low grayscale, holes are liable to move transversely while flowing from an anode to a cathode, and the transversely moving holes flow to an electroluminescent layer adjacent to said electroluminescent layer through a hole transport layer or a hole injection layer, which causes a phenomenon that the adjacent electroluminescent layer also emits light when said electroluminescent layer emits light, thereby causing a color cast phenomenon of the OLED device at the low grayscale. Similarly, when a certain electroluminescent layer is controlled to emit light at a low grayscale, electrons are liable to cause a transverse leakage current while flowing from a cathode to an anode, and the transverse leakage current flows to an electroluminescent layer adjacent to said electroluminescent layer through an electron transport layer or an electron injection layer, which causes a phenomenon that the adjacent electroluminescent layer also emits light when said electroluminescent layer emits light, thereby causing a color cast phenomenon of the OLED device at the low grayscale.

Therefore, in the related art, due to the above phenomenon, it is apt to cause display crosstalk between adjacent sub-pixels, and meanwhile, the OLED device is prone to color cast at a low grayscale.

Figure 1:
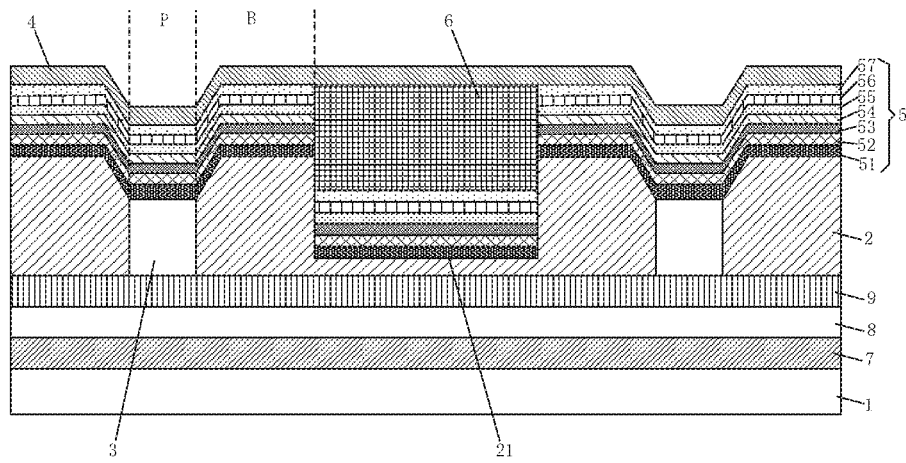
FIG. 1 is a schematic structural diagram of an OLED substrate according to some embodiments of the present disclosure.
Figure 2:
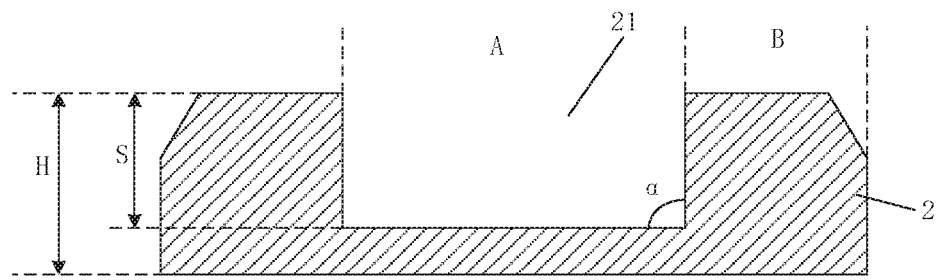
FIG. 2 is a schematic structural diagram of a pixel defining pattern in FIG. 1.

FIG. 1 is a schematic structural diagram of an OLED substrate according to some embodiments of the present disclosure, and FIG. 2 is a schematic structural diagram of a pixel defining pattern in FIG. 1. As shown in FIGS. 1 and 2, the OLED substrate includes a base substrate 1, and a pixel defining layer (PDL), first electrodes 3, a second electrode 4, and organic light emitting layers 5 on the base substrate 1, the organic light emitting layer 5 is between the first electrode 3 and the second electrode 4, the pixel defining layer includes a plurality of pixel defining patterns 2, each pixel defining pattern 2 is provided with a groove structure 21 therein, a plurality of sub-pixel units P are defined between the plurality of pixel defining patterns 2, the organic light emitting layer 5 is located in each sub-pixel unit P and extends to an upper surface of an adjacent pixel defining pattern 2, and part of the organic light emitting layers corresponding to the groove structure 21 is formed in the groove structure 21, thereby spacing the organic light emitting layers of the sub-pixel units adjacent to the groove structure 21 apart.

In some embodiments, as shown in FIG. 1, the first electrodes 3 are located in the sub-pixel units P defined by the pixel defining patterns 2, for example, each of the plurality of sub-pixel units P is provided with a corresponding one of the first electrodes 3 therein. The organic light emitting layers 5 are positioned on the first electrodes 3, and the second electrode 4 is positioned on the pixel defining patterns 2 and the organic light emitting layers 5 and covers the pixel defining patterns 2 and the organic light emitting layers 5.

In some embodiments, as shown in FIGS. 1 and 2, the organic light emitting layer 5 further extends from the sub-pixel unit P to an edge area B of the pixel defining pattern 2 close to the sub-pixel unit P, and as shown in FIG. 2, the edge area B is an area of the pixel defining pattern 2 except an area A where the groove structure 21 is located. Accordingly, the groove structure 21 can also function to define adjacent organic light emitting layers 5, in other words, the groove structure 21 can also function to define adjacent sub-pixels.

As shown in FIGS. 1 and 2, for example, the organic light emitting layer 5 includes a hole injection layer 51, a hole transport layer 52, an electron barrier layer 53, an electroluminescent layer 54, a hole barrier layer 55, an electron transport layer 56, and an electron injection layer 57. In some embodiments, in the subpixel unit P and the edge area B, the hole injection layer 51 is on the first electrode 3, the hole transport layer 52 is on the hole injection layer 51, the electron barrier layer 53 is on the hole transport layer 52, the electroluminescent layer 54 is on the electron barrier layer 53, the hole barrier layer 55 is on the electroluminescent layer 54, the electron transport layer 56 is on the hole barrier layer 55, and the electron injection layer 57 is on the electron transport layer 56.

The sub-pixel units include at least one of red sub-pixels, green sub-pixels, and blue sub-pixels. Accordingly, the electroluminescent layer 54 may include a red electroluminescent layer (R), a green electroluminescent layer (G), or a blue electroluminescent layer (B), for example, the electroluminescent layer 54 on the left of FIG. 1 is the red electroluminescent layer (R) and the electroluminescent layer 54 on the right of FIG. 1 is the green electroluminescent layer (G).

In some embodiments, for example, the second electrode 4 is on the electron injection layer 57 in the sub-pixel unit P and the electron injection layer 57 in the edge area B and covers the electron injection layer 57 in the sub-pixel unit P and the electron injection layer 57 in the edge area B.

Due to the groove structure 21 between adjacent organic light emitting layers 5, when adjacent electroluminescent layers 54 emitting light with different colors are formed, the adjacent electroluminescent layers 54 emitting light with different colors are not prone to overlapping, thereby alleviating the display crosstalk phenomenon between adjacent sub-pixels. In some embodiments, the groove structure 21 is in the middle of the pixel defining pattern 2.

In some embodiments, part of the organic light emitting layers 5 corresponding to the groove structure 21 is formed in the groove structures 21, for example, as shown in FIG. 1, the hole injection layer 51, the hole transport layer 52, the electron barrier layer 53, the hole barrier layer 55, the electron transport layer 56, and the electron injection layer 57 are also disposed in the groove structure 21. In the groove structure 21, the hole injection layer 51, the hole transport layer 52, the electron barrier layer 53, the hole barrier layer 55, the electron transport layer 56, and the electron injection layer 57 are sequentially disposed from bottom to top. Due to the groove structure 21, when the hole injection layer 51, the hole transport layer 52, the electron barrier layer 53, the hole barrier layer 55, the electron transport layer 56, and the electron injection layer 57 are formed by evaporation, the hole injection layer 51, the hole transport layer 52, the electron barrier layer 53, the hole barrier layer 55, the electron transport layer 56, and the electron injection layer 57 are naturally disconnected at the side walls of the groove structure 2 and fall into the groove structure 21, i.e., adjacent organic light emitting layers 5 are disconnected from each other. Therefore, when a certain electroluminescent layer 54 is controlled to emit light at a low grayscale, the phenomenon that an electroluminescent layer 54 adjacent to said electroluminescent layer 54 emits light due to a transverse movement of holes or electrons through the disconnected organic light emitting layer 5 in the groove structure 21 to the adjacent electroluminescent layer 54 hardly occurs, thereby alleviating the color cast of the OLED device at a low grayscale. In some embodiments, the hole injection layer 51, the hole transport layer 52, the electron barrier layer 53, the hole barrier layer 55, the electron transport layer 56, and the electron injection layer 57 in the groove structure 21 can also be removed, but do not need to be removed for saving the process steps.

In some embodiments, when the electroluminescent layer 54 is formed, the shadow of the electroluminescent layer 54 may also be disconnected at the groove structure 21 and falls into the groove structure 21, but due to the arrangement of the groove structures 21, adjacent organic light emitting layers 5 are disconnected from each other, so when a certain electroluminescent layer 54 is controlled to emit light, a case where holes or electrons move transversely to an adjacent electroluminescent layer 54 through the disconnected organic light emitting layer 5 in the groove structure 21 hardly occurs, thereby obviating the phenomenon of display crosstalk.

In some embodiments, as shown in FIG. 1, a filling layer 6 is further disposed in the groove structure 21, and the filling layer 6 is on the electron injection layer 57 in the groove structure 21. In some embodiments, the filling layer 6 is made of ink, for example, acrylic. In some embodiments, as shown in FIGS. 1 and 2, a height of an upper surface of the filling layer 6 relative to an upper surface of the base substrate 1 is equal to a height of an upper surface of the organic light emitting layer 5 in the edge area B relative to the upper surface of the base substrate 1, for example, the height of the upper surface of the filling layer 6 relative to the upper surface of the base substrate 1 is equal to the height of an upper surface of the electron injection layer 57 in the edge area B relative to the upper surface of the base substrate 1.

In some embodiments, for example, the second electrode 4 is on the electron injection layer 57 in the sub-pixel unit P, the electron injection layer 57 in the edge area B, and the filling layer 6, and covers the electron injection layer 57 in the sub-pixel unit P, the electron injection layer 57 in the edge area B, and the filling layer 6. Therefore, in the manufacturing process, before the formation of the second electrode 4, the groove structure 21 is filled with the filling layer 6 to have a flat surface, and the height of the filling layer 6 is equal to that of the electron injection layer 57 in the edge area B, so that when the second electrode 4 is formed, the second electrode 4 is uniformly connected at the groove structure 21, thereby obviating the phenomenon that the second electrode 4 is disconnected at the groove structure 21.

In some embodiments, as shown in FIG. 2, the depth S of the groove structure 21 is less than or equal to the thickness H of the pixel defining pattern 2. It should be noted that, FIG. 2 only shows a case where the depth S of the groove structure 21 is less than the thickness H of the pixel defining pattern 2, and in other embodiments, the depth S of the groove structure 21 may also be equal to the thickness H of the pixel defining pattern 2. In some embodiments, the depth S of the groove structure 21 is in a range of 1.0 micrometer to 1.5 micrometers, and the width of the groove structure 21 is in a range of 4.0 micrometers to 6.0 micrometers. Thus, it ensures uniformity of the filling layer 6 when the filling layer 6 is formed.

In order to ensure that the hole injection layer 51, the hole transport layer 52, the electron barrier layer 53, the hole barrier layer 55, the electron transport layer 56, and the electron injection layer 57 can be disconnected at the groove structure 21 when the hole injection layer 51, the hole transport layer 52, the electron barrier layer 53, the hole barrier layer 55, the electron transport layer 56, and the electron injection layer 57 are formed by evaporation, in some embodiments, an included angle α between a bottom wall and a side wall of the groove structure 21 is less than or equal to 90 degrees. In some embodiments, the included angle α between the bottom wall and the side wall of the groove structure 21 is equal to 90 degrees. In some embodiments, as shown in FIG. 1, the longitudinal section of the groove structure 21 has a rectangular shape.

Figure 3:
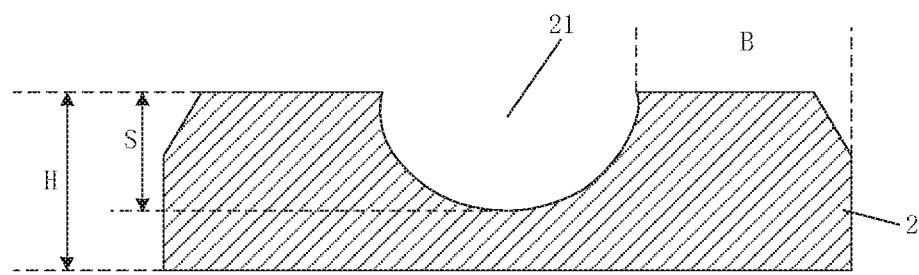
FIG. 3 is another schematic structural diagram of the pixel defining pattern in FIG. 1.

FIG. 3 is another schematic structural diagram of the pixel defining pattern in FIG. 1, and as shown in FIG. 3, in some embodiments, a longitudinal section of the groove structure 21 in a plane perpendicular to the base substrate and perpendicular to an extending direction (e.g., a direction perpendicular to the paper in FIG. 1) of the groove structure may also have an arc shape, and an arc angle of the arc shape is greater than 180 degrees. For example, the film layers of the organic light emitting layer 5 are naturally disconnected at the arc-shaped side wall of the groove structure 21 and fall into the groove structure 21, i.e., adjacent organic light emitting layers 5 are disconnected from each other. Therefore, when a certain electroluminescent layer 54 is controlled to emit light at a low grayscale, the phenomenon that an electroluminescent layer 54 adjacent to said electroluminescent layer 54 emits light due to transverse movement of holes or electrons through the disconnected organic light emitting layer 5 in the groove structure 21 to the adjacent electroluminescent layer 54 hardly occurs, thereby alleviating the color cast of the OLED device at a low grayscale.

In other embodiments, the longitudinal section of the groove structure 21 may have other shapes, which are not listed here.

In some embodiments, the first electrode 3 is an anode and the second electrode 4 is a cathode.

In some embodiments, as shown in FIG. 1, the OLED substrate further includes an insulating layer 7, a thin film transistor layer (TFT) 8, and a planarization layer (PLN) 9, the insulating layer 7 is on the base substrate 1, the thin film transistor layer 8 is on the insulating layer 7, the planarization layer 9 is on the thin film transistor layer 8, and the pixel defining layer is on the planarization layer 9. The insulating layer 7 is made of polyimide film (PI).

In some embodiments, the pixel defining pattern 2 is made of polyimide film.

In the OLED substrate according to the embodiments of the present disclosure, the sub-pixel units are defined between the pixel defining patterns, each pixel defining pattern is provided with the groove structure therein, the organic light emitting layer is in the sub-pixel unit, and part of the organic light emitting layers corresponding to the groove structure is formed in the groove structure. Due to the fact that the groove structure is arranged in the pixel defining pattern between adjacent organic light emitting layers, when adjacent electroluminescent layers emitting light with different colors are formed, the adjacent electroluminescent layers emitting light with different colors are not prone to overlapping, thereby alleviating the display crosstalk phenomenon between adjacent sub-pixels. Meanwhile, when a certain organic light emitting layer is controlled to emit light at a low grayscale, transverse movement of holes or electrons hardly occurs, thereby alleviating the color cast phenomenon of the OLED device at a low grayscale.

Figure 4:
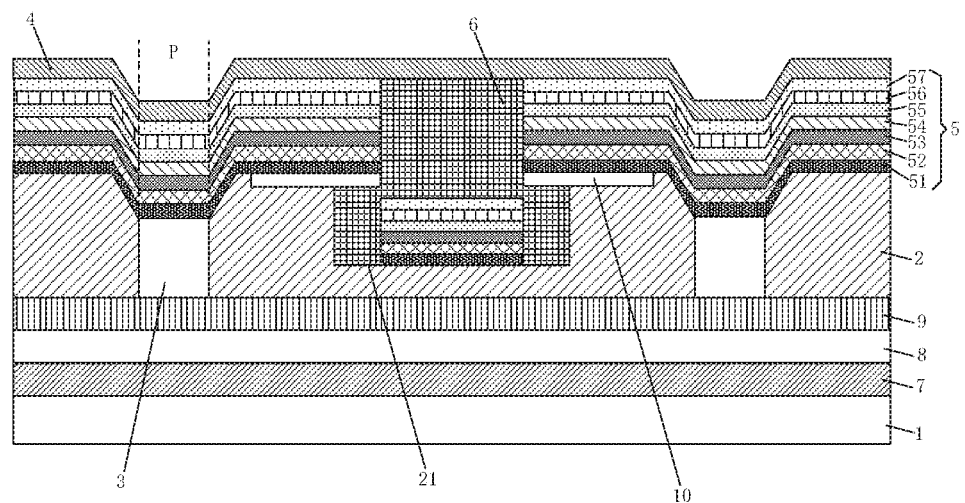
FIG. 4 is a schematic structural diagram of another OLED substrate according to some embodiments of the present disclosure.
Figure 5:
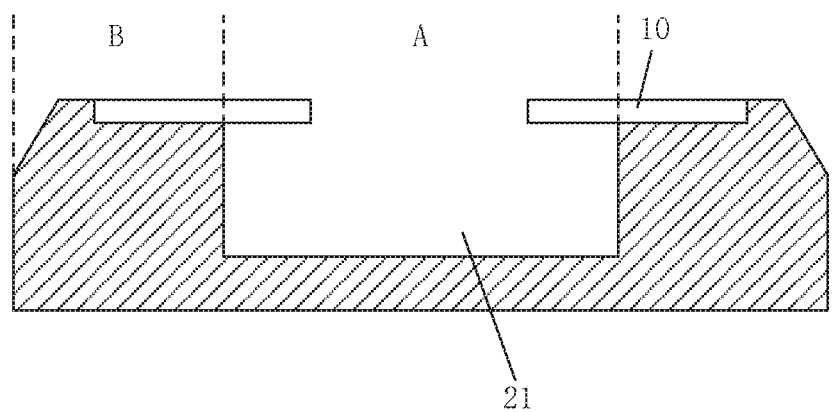
FIG. 5 is a schematic structural diagram of a pixel defining pattern and a thin film pattern shown in FIG. 4.

FIG. 4 is a schematic structural diagram of another OLED substrate according to some embodiments of the present disclosure, and FIG. 5 is a schematic structural diagram of a pixel defining pattern and a thin film pattern in FIG. 4. As shown in FIGS. 4 and 5, the structure of the OLED substrate according to an embodiment of the present disclosure differs from the structure of the OLED substrate according to the embodiments shown in FIGS. 1 and 2 in that: the OLED substrate further includes a thin film pattern 10, the thin film pattern 10 being on a side of the edge area B of the pixel defining pattern 2 away from the base substrate and extending from the edge area B to an area A where the groove structure 21 of the pixel defining pattern 2 is located and covering a portion of an opening of the groove structure 21. The thin film pattern 10 is located on a side of a portion of the organic light emitting layer on the pixel defining pattern close to the base substrate, and the organic light emitting layer 5 extends from the sub-pixel unit P onto the thin film pattern 10, for example, the organic light emitting layer 5 extends from the sub-pixel unit P to the area where the groove structure 21 of the pixel defining pattern 2 is located and covers a portion of the opening of the groove structure 21.

It can be seen in FIG. 5 that, one end of the thin film pattern 10 is located in the edge area B of the pixel defining pattern 2 and the other end of the thin film pattern 10 is located in the area A where the groove structure 21 of the pixel defining pattern 2 is located. For example, the thin film patterns 10 are disposed in the edge area B of the pixel defining pattern 2 on both sides of the groove structure 21, and the thin film patterns 10 on both sides each cover a portion of the opening of the groove structure 21.

In some embodiments, the thickness of the thin film pattern 10 is in a range of 0.18 micrometers to 0.22 micrometers. In some embodiments, the thickness of the thin film pattern 10 is 0.20 micrometers. The width of the thin film pattern 10 is in a range of 6.0 micrometers to 8.0 micrometers.

In some embodiments, the thin film pattern is made of a polyimide film ion-implanted with $Si^{4+}$ ions.

For example, the film layers of the organic light emitting layer 5 are naturally disconnected at the thin film pattern 10 at the opening of the groove structure 21 and fall into the groove structure 21, i.e., adjacent organic light emitting layers 5 are disconnected from each other. Therefore, when a certain electroluminescent layer 54 is controlled to emit light at a low grayscale, the phenomenon that an electroluminescent layer 54 adjacent to said electroluminescent layer 54 emits light due to a transverse movement of holes or electrons through the disconnected organic light emitting layer 5 in the groove structure 21 to the adjacent electroluminescent layer 54 hardly occurs, thereby alleviating the color cast of the OLED device at a low grayscale.

For the description of other structures of the OLED substrate according this embodiment, reference may be made to the embodiments shown in FIGS. 1 and 2, which are not repeated herein.

In the OLED substrate according to the embodiments of the present disclosure, since the thin film pattern covers a portion of the opening of the groove structure, the part of the organic light emitting layers corresponding to the groove structure is formed in the groove structure. Due to the fact that the groove structure is arranged in the pixel defining pattern between adjacent organic light emitting layers, when adjacent electroluminescent layers emitting light with different colors are formed, the adjacent electroluminescent layers emitting light with different colors are not prone to overlapping, thereby alleviating the display crosstalk phenomenon between adjacent sub-pixels. Meanwhile, when a certain organic light emitting layer is controlled to emit light at a low grayscale, transverse movement of holes or electrons hardly occurs, thereby alleviating the color cast phenomenon of the OLED device at a low grayscale.

Some embodiments of the present disclosure provide a display device including an encapsulation structure and an OLED substrate that are oppositely disposed.

In this embodiment, the encapsulation structure may be a glass cover plate or a multilayer film. The encapsulation structure may also be other suitable structures, which are not listed here. In this embodiment, the encapsulation with the glass cover plate is in a rigid manner, and the encapsulation with the multilayer film is in a flexible manner.

In this embodiment, a module layer is further disposed on the encapsulation structure, and the module layer includes, but is not limited to, a polarizer, an IC bonding layer, a touch-and-sensor layer, a glass cover plate, or the like.

In this embodiment, the OLED substrate includes the OLED substrate according to the embodiment shown in FIGS. 1 and 2 or the OLED substrate according to embodiment shown in FIG. 4. For the description of the OLED substrate of this embodiment, reference may be made to the embodiment shown in FIG. 1 and FIG. 2 or the embodiment shown in FIG. 4, which is not repeated herein.

In the display device according to the embodiment of the present disclosure, sub-pixel units are defined between the pixel defining patterns, each pixel defining pattern is provided with a groove structure therein, and the organic light emitting layer is in the sub-pixel unit. Due to the fact that the groove structure is arranged in the pixel defining pattern between adjacent organic light emitting layers, when adjacent electroluminescent layers emitting light with different colors are formed, the adjacent electroluminescent layers emitting light with different colors are not prone to overlapping, thereby alleviating the display crosstalk phenomenon between adjacent sub-pixels. Meanwhile, when a certain organic light emitting layer is controlled to emit light at a low grayscale, transverse movement of holes or electrons hardly occurs, thereby alleviating the color cast phenomenon of the OLED device at a low grayscale.

Figure 6A:
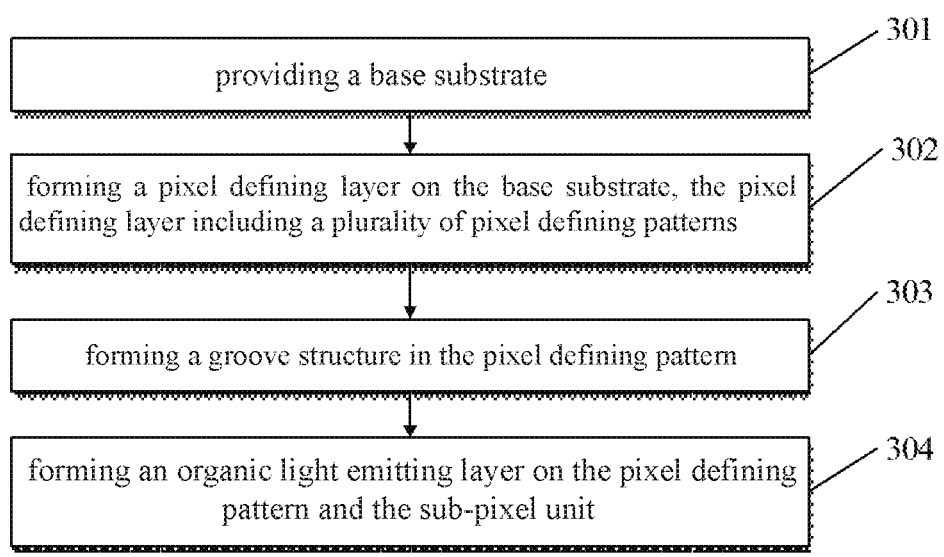
FIG. 6a is a flowchart of a manufacturing method of an OLED substrate according to some embodiments of the present disclosure.

FIG. 6a is a flowchart of a method for manufacturing an OLED substrate according to some embodiments of the present disclosure, and as shown in FIG. 6a, the method for manufacturing an OLED substrate includes steps 301 to 304.

In step 301, a substrate is provided.

In step 302, a pixel defining layer is formed on the base substrate, the pixel defining layer including a plurality of pixel defining patterns defining a plurality of sub-pixel units therebetween.

In step 303, a groove structure is formed in the pixel defining pattern.

In step 304, an organic light emitting layer is formed on the pixel defining pattern and the sub-pixel unit.

Part of the organic light emitting layers corresponding to the groove structure is formed in the groove structure.

In the method for manufacturing the OLED substrate according to the embodiments of the present disclosure, the groove structure is formed in the pixel defining pattern, the organic light emitting layer is formed on the pixel defining pattern and the sub-pixel unit, and the part of the organic light emitting layers corresponding to the groove structure is formed in the groove structure, so that when adjacent electroluminescent layers emitting light with different colors are formed, the adjacent electroluminescent layers emitting light with different colors are not prone to overlapping, thereby alleviating the display crosstalk phenomenon between adjacent sub-pixels. Meanwhile, when a certain organic light emitting layer is controlled to emit light at a low grayscale, transverse movement of holes or electrons hardly occurs, thereby alleviating the color cast phenomenon of the OLED device at a low grayscale.

Figure 6B:
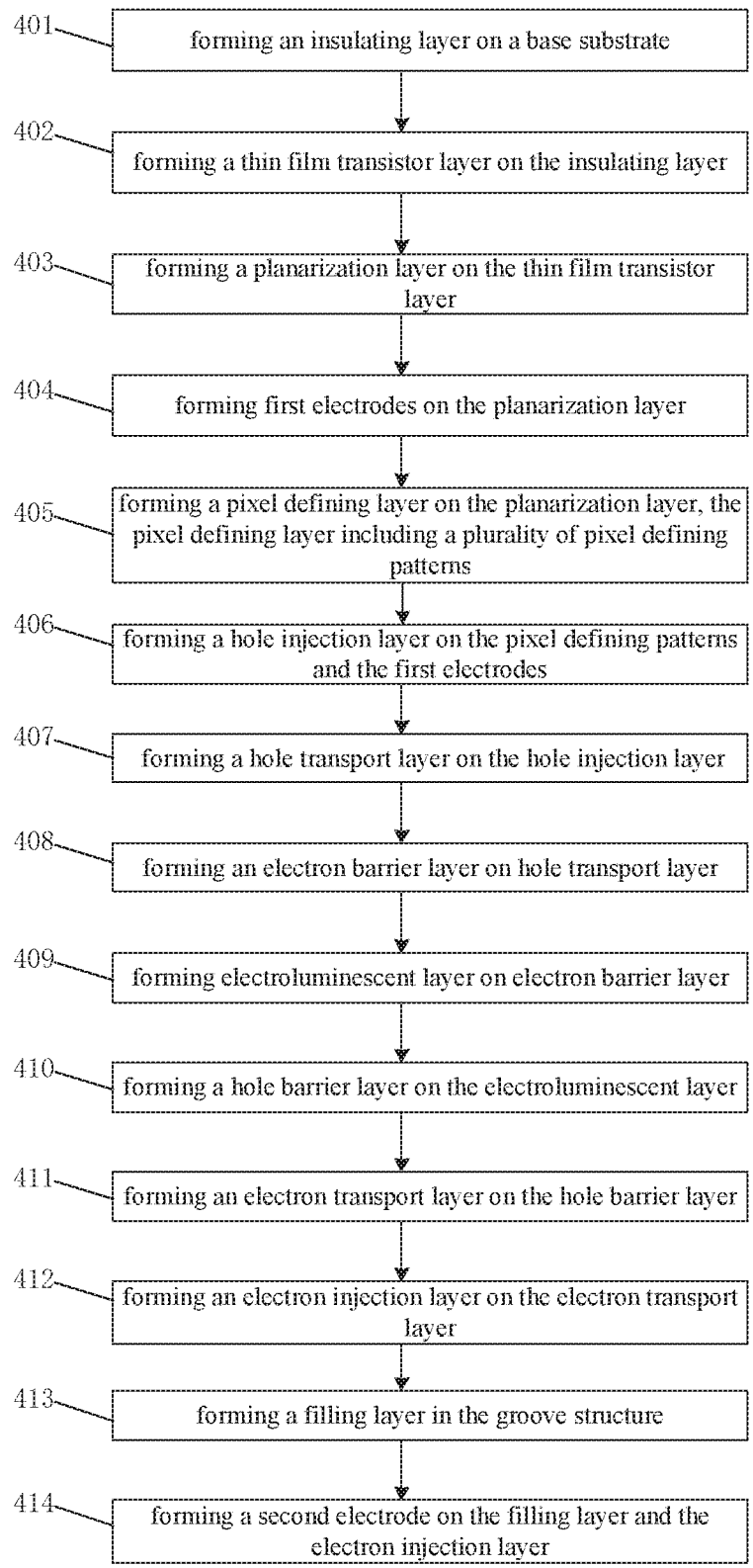
FIG. 6b is a flowchart of another manufacturing method of an OLED substrate according to some embodiments of the present disclosure.

FIG. 6b is a flowchart of a method for manufacturing an OLED substrate according to some embodiments of the present disclosure, and as shown in FIG. 6b, the method for manufacturing an OLED substrate includes steps 401 to 414.

In step 401, an insulating layer is formed on a base substrate.

Figure 7:
FIG. 7 is a schematic diagram of forming a buffer layer.

As shown in FIG. 7, an insulating layer 7 is formed on the base substrate 1.

In step 402, a thin film transistor layer is formed on the insulating layer.

Figure 8:
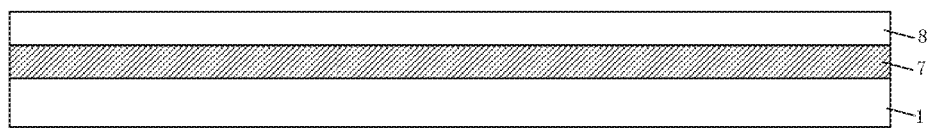
FIG. 8 is a schematic diagram of forming a thin film transistor layer.

As shown in FIG. 8, a thin film transistor layer 8 is formed on the insulating layer 7.

In step 403, a planarization layer is formed on the thin film transistor layer.

Figure 9:
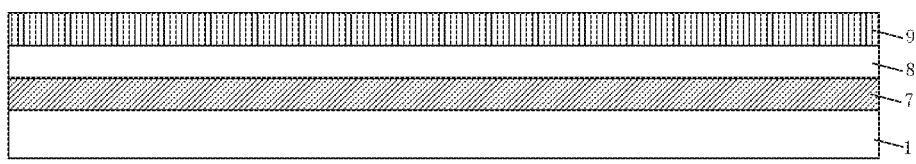
FIG. 9 is a schematic diagram of forming a planarization layer.

As shown in FIG. 9, a planarization layer 9 is formed on the thin film transistor layer 8.

In step 404, a first electrode is formed on the planarization layer.

For example, step 404 includes steps 4041 and 4042.

In step 4041, a first electrode material layer is deposited on the planarization layer.

Figure 10:
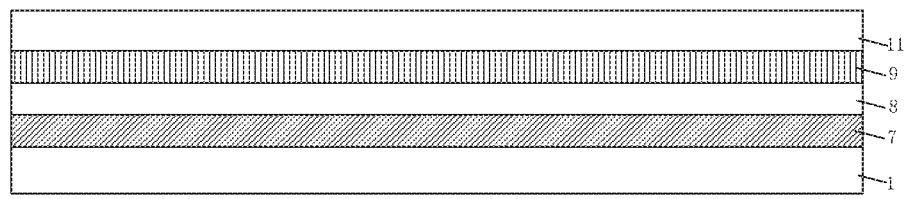
FIG. 10 is a schematic diagram of depositing a first electrode material layer.

As shown in FIG. 10, a first electrode material layer 11 is deposited on the planarization layer 9.

In step 4042, a patterning process is performed on the first electrode material layer to form first electrodes.

Figure 11:
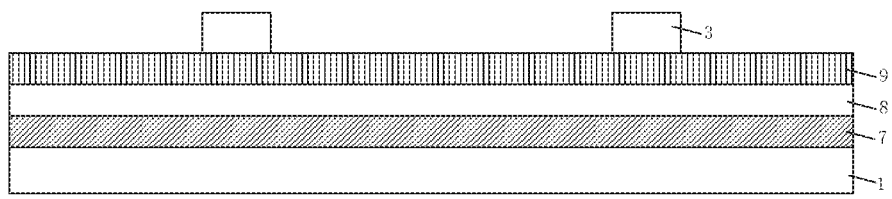
FIG. 11 is a schematic diagram of forming a first electrode.

As shown in FIG. 11, a patterning process is performed on the first electrode material layer 11 to form the first electrodes 3. The patterning process performed on the first electrode material layer 11 includes processes such as photoresist coating, exposure, development, etching, and photoresist stripping.

In step 405, a pixel defining layer is formed on the planarization layer, the pixel defining layer including a plurality of pixel defining patterns, each pixel defining pattern being provided with a groove structure therein, sub-pixel units being defined between the pixel defining patterns, and the first electrodes being located in the sub-pixel units.

For example, step 405 includes steps 4051 through 4053.

In step 4051, a pixel defining material layer is deposited on the planarization layer.

Figure 12:
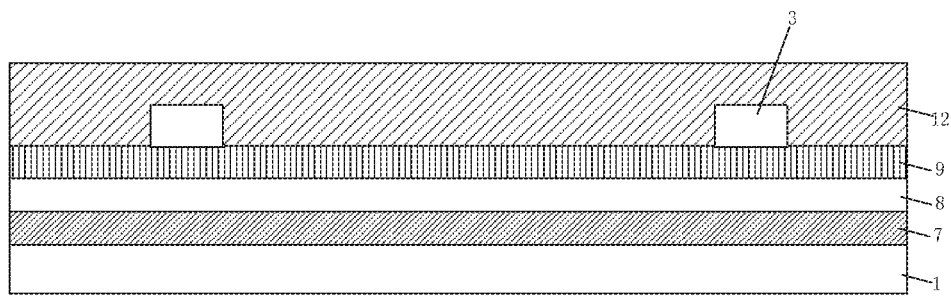
FIG. 12 is a schematic diagram of depositing a pixel defining material layer.

As shown in FIG. 12, a pixel defining material layer 12 is deposited on the planarization layer 9.

In step 4052, a patterning process is performed on the pixel defining material layer to form a plurality of pixel defining patterns.

Figure 13:
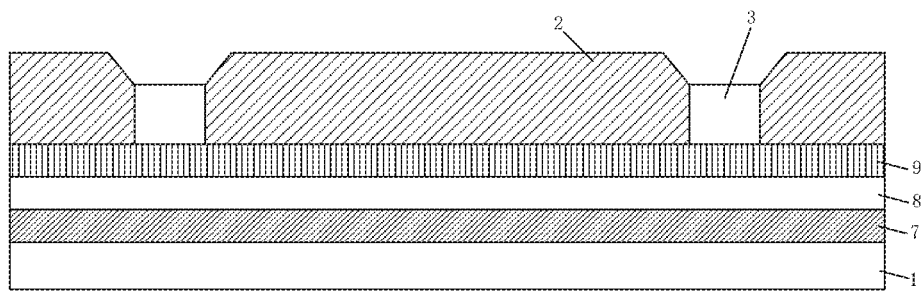
FIG. 13 is a schematic diagram of forming a pixel defining pattern.

As shown in FIGS. 12 and 13, a patterning process is performed on the pixel defining material layer 12 to form a plurality of pixel defining patterns 2. The patterning process performed on the pixel defining material layer 12 includes processes such as exposure and development.

In step 4053, a patterning process is performed on the pixel defining pattern to form a groove structure.

Figure 14:
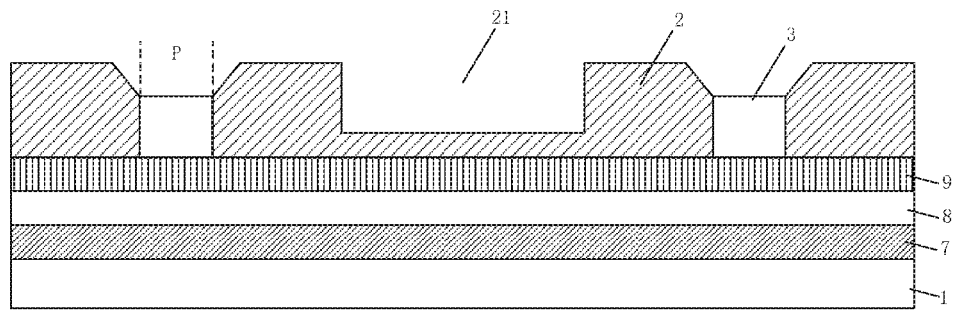
FIG. 14 is a schematic diagram of forming a groove structure.

As shown in FIG. 14, a groove structure 21 is formed by performing a patterning process on the pixel defining pattern 2 by, for example, dry etching (e.g., sputter etching). As shown in FIG. 14, the included angle between the bottom wall and the side wall of the groove structure is formed to be less than or equal to 90 degrees, and in some embodiments, the longitudinal section of the groove structure 21 has a rectangular shape.

In this embodiment, as shown in FIG. 14, sub-pixel units P are defined between adjacent pixel defining patterns 2, and each first electrode 3 is located in a corresponding sub-pixel unit P.

Figure 15A:
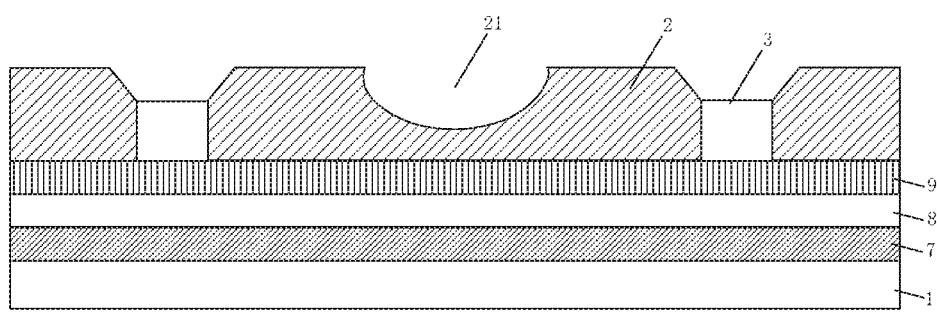
FIG. 15A is a schematic diagram of forming a groove structure.
Figure 15B:
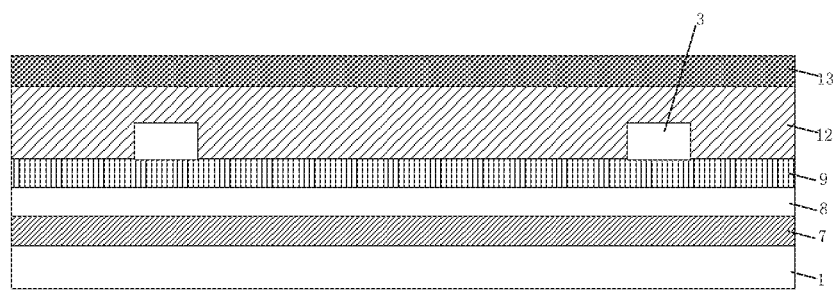
FIG. 15B is a schematic diagram of forming a layer of photoresist.
Figure 15C:
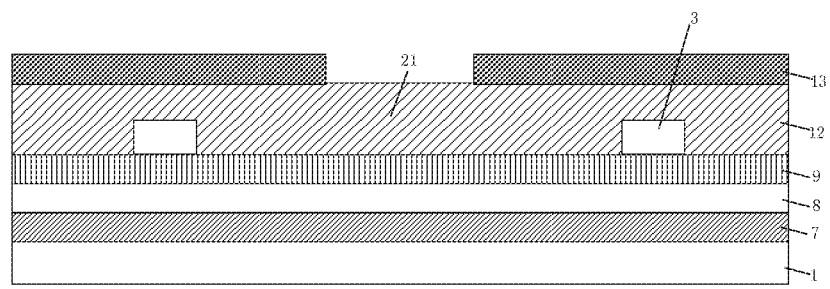
FIG. 15C is a schematic diagram of forming an opening.
Figure 15D:
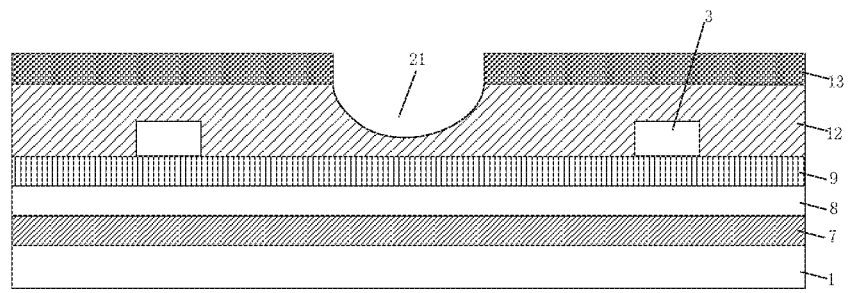
FIG. 15D is a schematic diagram of forming a pixel defining pattern.

In this embodiment, as shown in FIG. 15A, the longitudinal section of the groove structure 21 may also have an arc shape, and the arc angle of the arc shape is formed to be greater than 180 degrees. In a case where the longitudinal section of the groove structure 21 has an arc shape, as shown in FIGS. 15B to 15D, after the pixel defining material layer 12 is formed, a layer of photoresist (PR) 13 may be coated on the pixel defining material layer 12 first, then an opening 14 is etched in the photoresist 13 through an exposure process, and thereafter, the groove structure 21 is etched at the opening 14 by wet etching. After the formation of the groove structure 21, the photoresist 13 is removed. As shown in FIG. 15A, a patterning process including exposure and development processes is performed on the pixel defining material layer 12 at last to form the pixel defining patterns 2.

In step 406, a hole injection layer is formed on the pixel defining patterns and the first electrodes.

Figure 16:
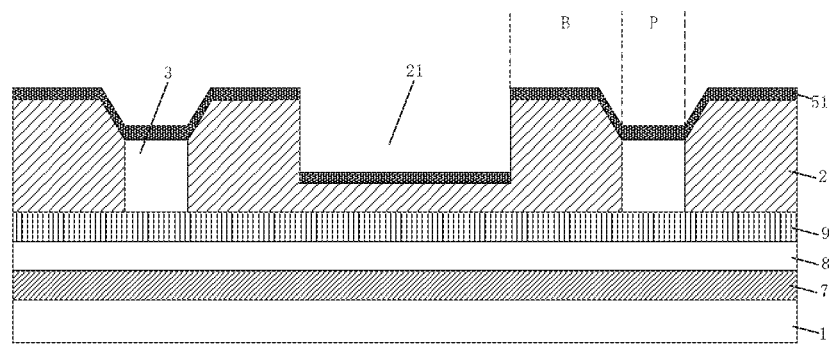
FIG. 16 is a schematic diagram of forming a hole injection layer.

As shown in FIG. 16, a hole injection layer 51 is formed on the pixel defining patterns 2 and the first electrodes 3. For example, the hole injection layer 51 is formed on the pixel defining patterns 2 and the first electrodes 3 by an organic material evaporation (EV evaporation) under vacuum using an open mask. In some embodiments, when the hole injection layer 51 is formed by evaporation, a portion of the hole injection layer 51 corresponding to the groove structure 21 is naturally disconnected at the groove structure 21 and is formed in the groove structure 21, and the remaining portion of the hole injection layer 51 is located in the sub-pixel unit P and extends from the sub-pixel unit P to the edge area B close to the sub-pixel unit P.

In step 407, a hole transport layer is formed on the hole injection layer.

Figure 17:
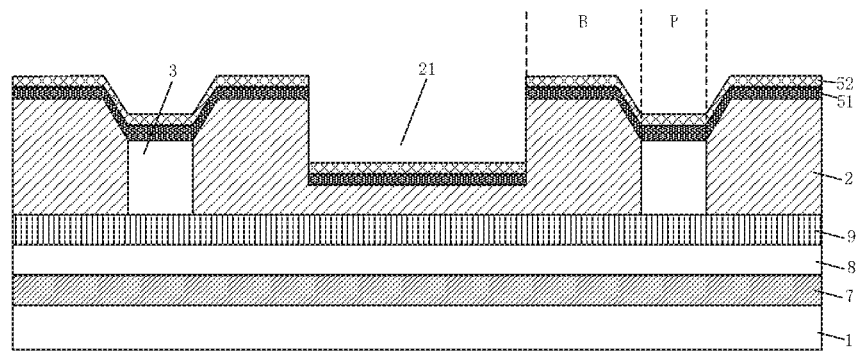
FIG. 17 is a schematic diagram of forming a hole transport layer.

As shown in FIG. 17, a hole transport layer 52 is formed on the hole injection layer 51. For example, the hole transport layer 52 is formed on the hole injection layer 51 by EV evaporation using an open mask. In the present embodiment, when the hole transport layer 52 is formed by evaporation, the portion of the hole transport layer 52 corresponding to the groove structure 21 is naturally disconnected at the groove structure 21 and is formed in the groove structure 21, and the hole transport layer 52 is on the hole injection layer 51 in the groove structure 21. The remaining portion of the hole transport layer 52 is located on the hole injection layer 51 in the sub-pixel unit P and extends from the sub-pixel unit P to the edge area B close to the sub-pixel unit P.

In step 408, an electron barrier layer is formed on the hole transport layer.

Figure 18:
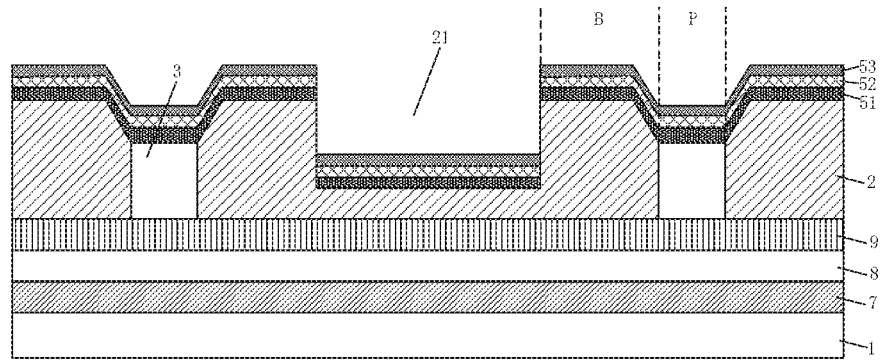
FIG. 18 is a schematic diagram of forming an electron barrier layer.

As shown in FIG. 18, an electron barrier layer 53 is formed on the hole transport layer 52. For example, the electron barrier layer 53 is formed on the hole transport layer 52 by EV deposition using a fine metal mask (FMM). In the present embodiment, when the electron barrier layer 53 is formed by evaporation, the portion of the electron barrier layer 53 corresponding to the groove structure 21 is naturally disconnected at the groove structure 21 and is formed in the groove structure 21. In the groove structure 21, the electron barrier layer 53 is located on the hole transport layer 52. The remaining portion of the electron barrier layer 53 is located on the hole transport layer 52 in the sub-pixel unit P and extends from the sub-pixel unit P to the edge area B close to the sub-pixel unit P.

In step 409, an electroluminescent layer is formed on the electron barrier layer.

Figure 19:
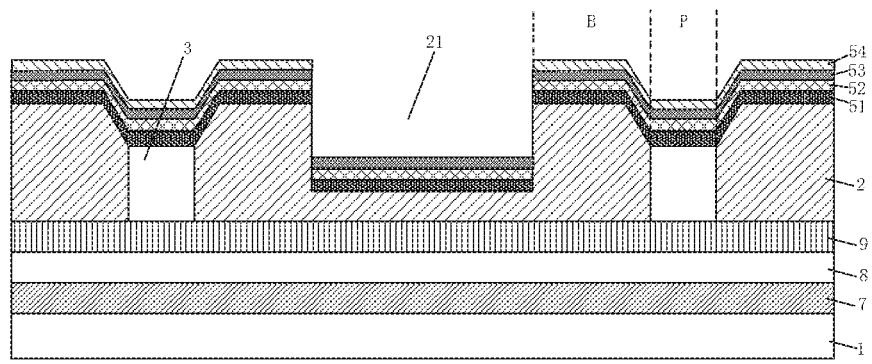
FIG. 19 is a schematic diagram of forming an electroluminescent layer.

As shown in FIG. 19, an electroluminescent layer 54 is formed on the electron barrier layer 53. For example, the electroluminescent layer 54 is formed on the electron barrier layer 53 by EV evaporation using an FMM. In some embodiments, the electroluminescent layer 54 is not formed in groove structure 21. However, in some embodiments, there may be a shadow of the electroluminescent layer 54 when the electroluminescent layer 54 is formed, and the shadow is disconnected from the electroluminescent layer 54 at the groove structure 21 and formed in the groove structure 21 during the evaporation.

In step 410, a hole barrier layer is formed on the electroluminescent layer.

Figure 20:
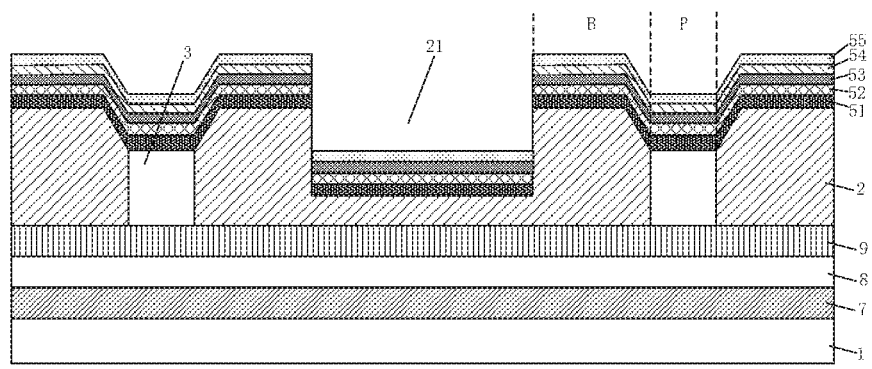
FIG. 20 is a schematic diagram of forming a hole barrier layer.

As shown in FIG. 20, a hole barrier layer 55 is formed on the electroluminescent layer 54. For example, the hole barrier layer 55 is formed on the electroluminescent layer 54 by EV evaporation using an open mask. In the present embodiment, when the hole barrier layer 55 is formed by evaporation, the portion of the hole barrier layer 55 corresponding to the groove structure 21 is naturally disconnected at the groove structure 21 and formed in the groove structure 21. In the groove structure 21, the hole barrier layer 55 is located on the electron barrier layer 53. The remaining portion of the hole barrier layer 55 is located on the electroluminescent layer 54 in the sub-pixel unit P and extends from the sub-pixel unit P to the edge area B close to the sub-pixel unit P.

In step 411, an electron transport layer is formed on the hole barrier layer.

Figure 21:
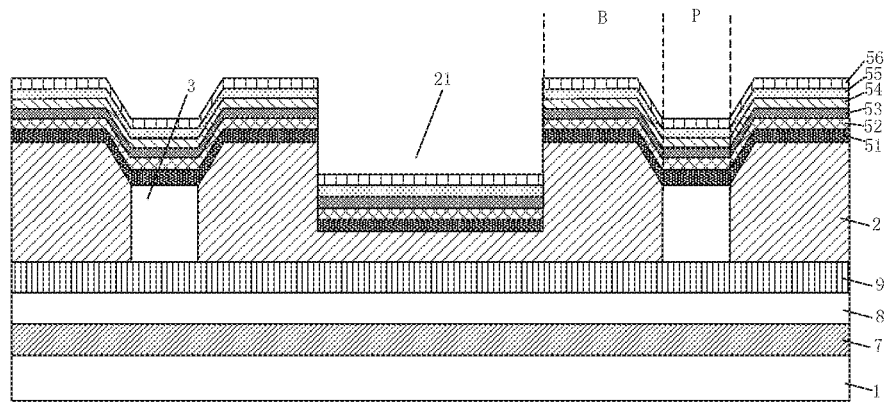
FIG. 21 is a schematic diagram of forming an electron transport layer.

As shown in FIG. 21, an electron transport layer 56 is formed on the hole barrier layer 55. For example, the electron transport layer 56 is formed on the hole barrier layer 55 by EV evaporation using an open mask. In the present embodiment, when the electron transport layer 56 is formed by evaporation, the portion of the electron transport layer 56 corresponding to the groove structure 21 is naturally disconnected at the groove structure 21 and formed in the groove structure 21. In the groove structure 21, the electron transport layer 56 is located on the hole barrier layer 55. The remaining portion of the electron transport layer 56 is located on the hole barrier layer 55 in the sub-pixel unit P and extends from the sub-pixel unit P to the edge area B close to the sub-pixel unit P.

In step 412, an electron injection layer is formed on the electron transport layer.

Figure 22:
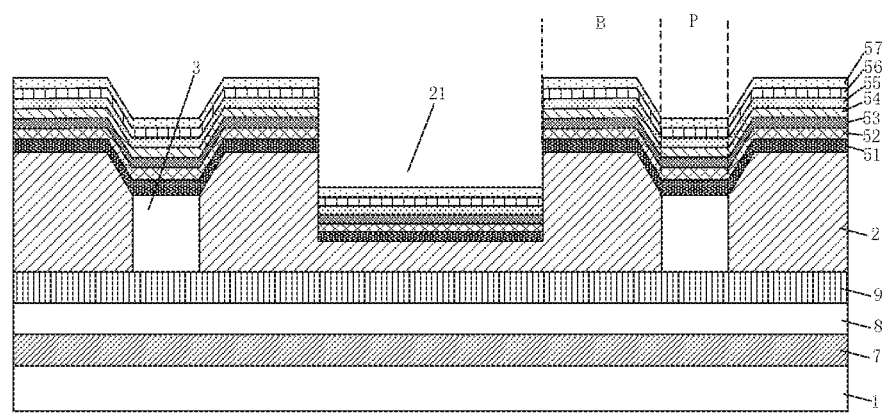
FIG. 22 is a schematic diagram of forming an electron injection layer.

As shown in FIG. 22, an electron injection layer 57 is formed on the electron transport layer 56. For example, the electron injection layer 57 is formed on the electron transport layer 56 by EV evaporation using an open mask. In the present embodiment, when the electron injection layer 57 is formed by evaporation, the portion of the electron injection layer 57 corresponding to the groove structure 21 is naturally disconnected at the groove structure 21 and is formed in the groove structure 21. In the groove structure 21, the electron injection layer 57 is located on the electron transport layer 56. The remaining portion of the electron injection layer 57 is located on the electron transport layer 56 in the sub-pixel unit P and extends from the sub-pixel unit P to the edge area B close to the sub-pixel unit P.

In step 413, a filling layer is formed in the groove structure.

For example, step 413 includes steps 4131 and 4132.

In step 4131, a filling material is formed in the groove structure.

The filling material is ink, such as acrylic. For example, an ink-jet printing (IJP) technology is used to fill the groove structure 21 with the filling material, and the viscosity of the filling material is controlled to ensure the uniformity of the filling.

In step 4132, the filling material is cured to form a filling layer.

Figure 23:
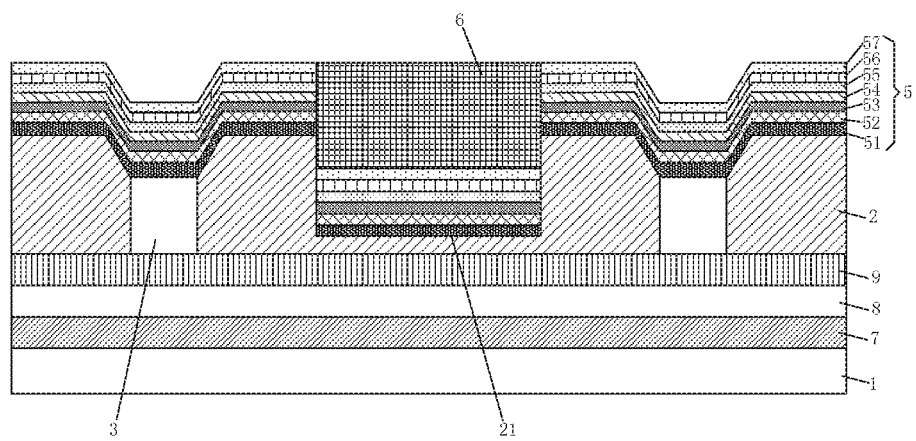
FIG. 23 is a schematic diagram of forming a filling layer.

As shown in FIG. 23, the filling material is cured to form a filling layer 6. For example, the filling material is UV cured to form the filling layer 6.

In step 414, a second electrode is formed on the filling layer and the electron injection layer.

Figure 24:
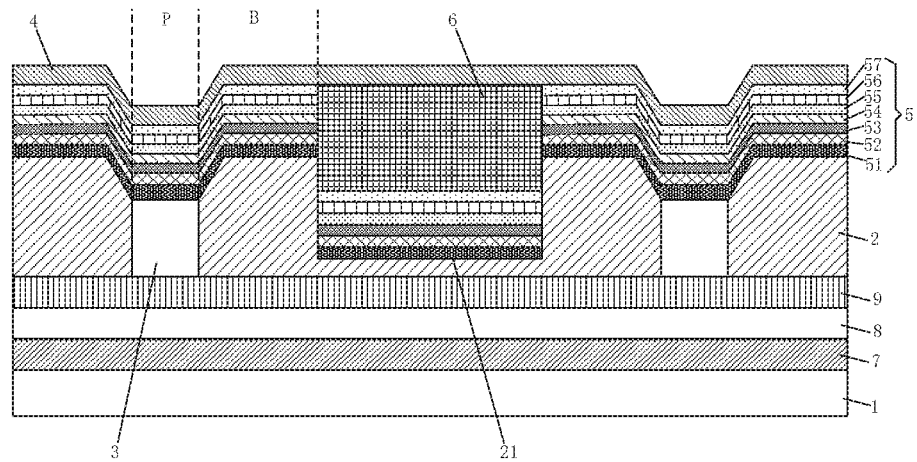
FIG. 24 is a schematic diagram of forming a second electrode.

As shown in FIG. 24, the second electrode 4 is formed on the filling layer 6, the electron injection layer 57 in the sub-pixel unit P, and the electron injection layer 57 in the edge area B, and the second electrode 4 covers the filling layer 6, the electron injection layer 57 in the sub-pixel unit P, and the electron injection layer 57 in the edge area B.

The method for manufacturing the OLED substrate according to this embodiment is used to manufacture the OLED substrate according to the embodiment shown in FIGS. 1 and 2, and for other specific descriptions of the OLED substrate, reference may be made to the embodiment shown in FIGS. 1 and 2, which are not repeated here.

In the method for manufacturing an OLED substrate according to this embodiment, the sub-pixel units are defined between pixel defining patterns, each pixel defining pattern is provided with a groove structure therein, and the organic light emitting layer is located in the sub-pixel unit. Due to the fact that the groove structure is arranged in the pixel defining pattern between adjacent organic light emitting layers, when adjacent electroluminescent layers emitting light with different colors are formed, the adjacent electroluminescent layers emitting light with different colors are not prone to overlapping, thereby alleviating the display crosstalk phenomenon between adjacent sub-pixels. Meanwhile, when a certain organic light emitting layer is controlled to emit light at a low grayscale, transverse movement of holes or electrons hardly occurs, thereby alleviating the color cast phenomenon of the OLED device at a low grayscale.

Figure 29:
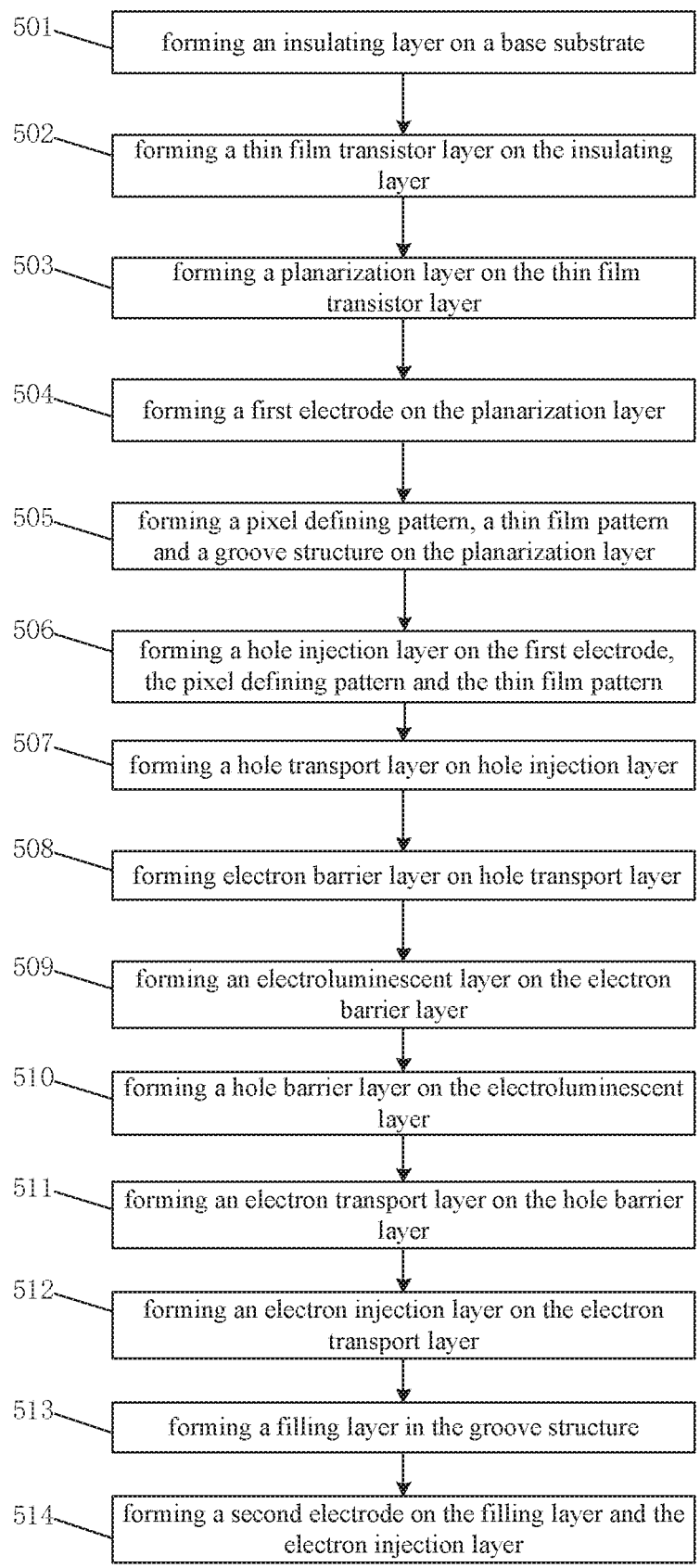
FIG. 29 is a flowchart of a manufacturing method of an OLED substrate according to an embodiment of the present disclosure.

FIG. 29 is a flowchart of a method for manufacturing an OLED substrate according to some embodiments of the present disclosure, and as shown in FIG. 29, the method for manufacturing an OLED substrate includes steps 501 to 514.

For steps 501 to 504, reference is made to steps 401 to 404 in the method for manufacturing an OLED substrate according to the embodiment shown in FIG. 6b, which are not repeated herein.

In step 505, a pixel defining pattern, a thin film pattern and a groove structure are formed on the planarization layer.

For example, step 505 includes steps 5051 to 5055.

In step 5051, a pixel defining material layer is formed on the planarization layer.

As shown in FIG. 12, a pixel defining material layer 12 is formed on the planarization layer 9. The pixel defining material layer 12 is made of polyimide film.

In step 5052, a patterning process is performed on the pixel defining material layer to form a pattern space.

Figure 25:
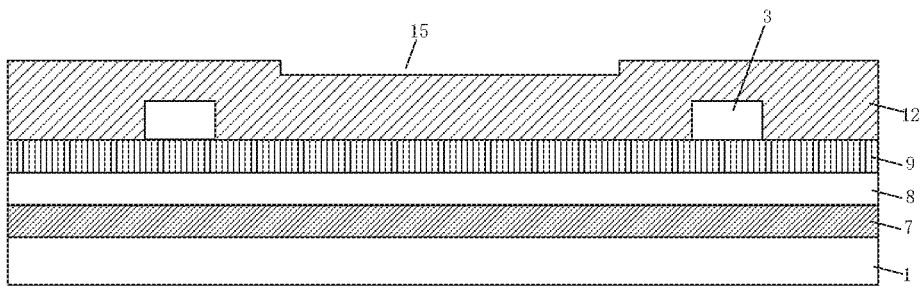
FIG. 25 is a schematic diagram of a patterning space.

As shown in FIG. 25, a patterning process is performed on the pixel defining material layer 12 to form a pattern space 15.

In step 5053, a thin film material layer is formed in the pattern space.

Figure 26:
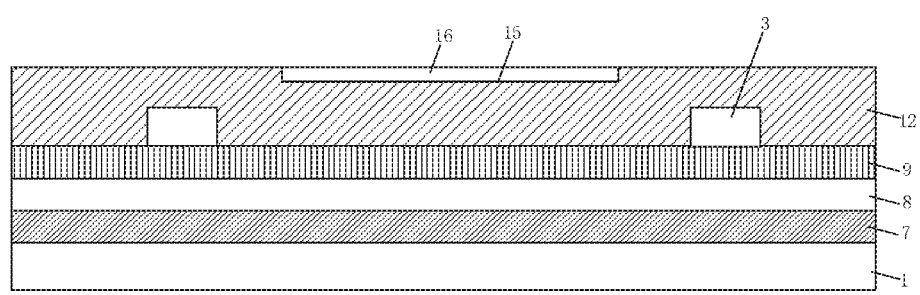
FIG. 26 is a schematic diagram of forming a thin film material layer.

As shown in FIG. 26, the thin film material layer 16 is formed in the pattern space 15. The film material layer 16 is made of a polyimide film ion-implanted with $Si^{4+}$ ions.

In step 5054, a patterning process is performed on the thin film material layer and the pixel defining material layer to form a thin film pattern and a groove structure, for example, the thin film material layer covers a portion of the opening of the groove structure.

Figure 27:
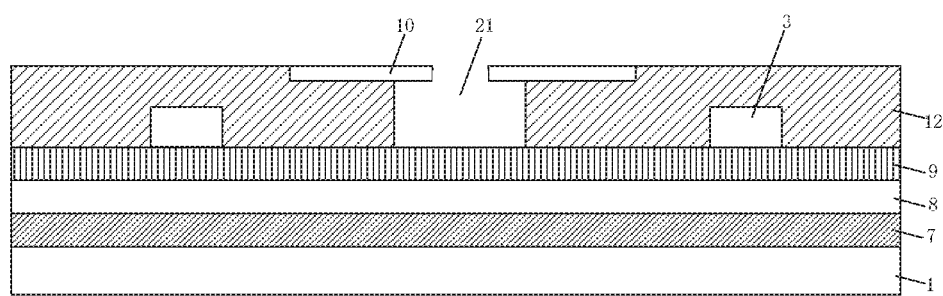
FIG. 27 is a schematic diagram of forming a thin film pattern and a groove structure.

As shown in FIGS. 26 and 27, a patterning process is performed on the thin film material layer 16 and the pixel defining material layer 12 to form the thin film pattern 10 and the groove structure 21. For example, after the thin film material layer 16 is subjected to an exposure process, the thin film material layer 16 and the pixel defining material layer 12 are etched using an etching solution by a wet etching method, where an etching rate of the thin film material layer 16 is lower than an etching rate of the pixel defining material layer 12, and finally, the thin film pattern 10 and the groove structure 21 shown in FIG. 27 are formed.

In step 5055, a photolithography process is performed on the pixel defining material layer to form pixel defining patterns.

Figure 28:
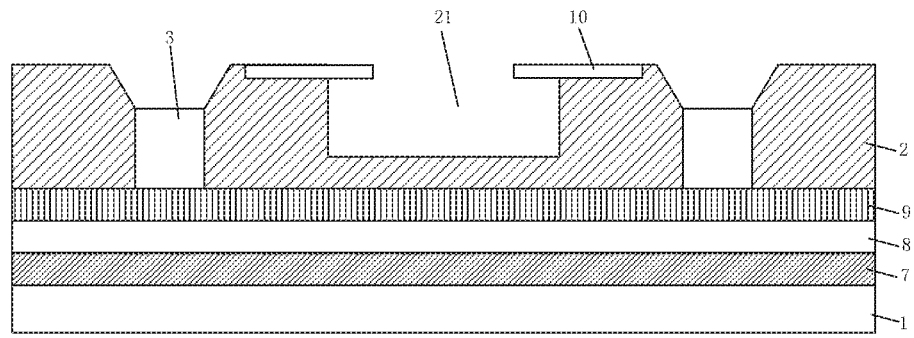
FIG. 28 is a schematic diagram of forming a pixel defining pattern.

As shown in FIGS. 27 and 28, a photolithography process is performed on the pixel defining material layer 12 to form pixel defining patterns 2.

In step 506, a hole injection layer is formed on the first electrode, the pixel defining pattern and the thin film pattern.

As shown in FIG. 4, the hole injection layer 51 is formed on the first electrode 3, the pixel defining pattern 2, and the thin film pattern 10.

For steps 507 to 514, reference is made to steps 407 to 414 in the method for manufacturing an OLED substrate according to the embodiment shown in FIG. 6b, which are not repeated herein.

The method for manufacturing the OLED substrate according to this embodiment is used to manufacture the OLED substrate according to the embodiment shown in FIG. 4, and for other specific descriptions of the OLED substrate, reference may be made to the embodiment shown in FIG. 4, which are not repeated here.

In the method for manufacturing an OLED substrate according to this embodiment, the sub-pixel units are defined between pixel defining patterns, each pixel defining pattern is provided with a groove structure therein, and the organic light emitting layer is located in the sub-pixel unit. Due to the fact that the groove structure is arranged in the pixel defining pattern between adjacent organic light emitting layers, when adjacent electroluminescent layers emitting light with different colors are formed, the adjacent electroluminescent layers emitting light with different colors are not prone to overlapping, thereby alleviating the display crosstalk phenomenon between adjacent sub-pixels. Meanwhile, when a certain organic light emitting layer is controlled to emit light at a low grayscale, transverse movement of holes or electrons hardly occurs, thereby alleviating the color cast phenomenon of the OLED device at a low grayscale.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present disclosure, and these variations and improvements shall also fall into the protection scope of the present disclosure.

What is claimed is:

1. An organic light emitting diode (OLED) substrate, comprising:
   a base substrate;
   a pixel defining layer on the base substrate, the pixel defining layer comprising a plurality of pixel defining patterns for defining a plurality of sub-pixel units, each of the plurality of sub-pixel units being defined between adj acent two of the plurality of pixel defining patterns; and
   an organic light emitting layer on a side of the pixel defining layer away from the base substrate, the organic light emitting layer comprising a first portion in each sub-pixel unit and a second portion on each pixel defining pattern,
   wherein each pixel defining pattern is provided with a groove structure therein, and part of the second portion of the organic light emitting layer in the groove structure and the other part of the second portion of the organic light emitting layer are spaced apart from each other,
   wherein the OLED substrate further comprises a filling layer and a second electrode on a side of the filling layer and the organic light emitting layer away from the base substrate, the filling layer is in the groove structure and on the part of the second portion of the organic light emitting layer in the groove structure, and a surface of the filling layer away from the base substrate is at the same level as that of a surface of the other part of the second portion of the organic light emitting layer away from the base substrate, such that the second electrode is disposed on a substantially flat surface of the filling layer and the organic light emitting layer.

2. The OLED substrate of claim 1, wherein the groove structure has a depth in a range of 1.0 micrometer to 1.5 micrometers.

3. The OLED substrate of claim 1, wherein the groove structure has a width in a range of 4.0 micrometers to 6.0 micrometers.

4. The OLED substrate of claim 1, wherein an included angle between a bottom wall and a side wall of the groove structure is less than or equal to 90 degrees.

5. The OLED substrate of claim 1, wherein a cross-section of the groove structure in a plane perpendicular to the base substrate and perpendicular to an extending direction of the groove structure has an arc shape, and an arc angle of the arc shape is greater than 180 degrees.

6. The OLED substrate of claim 1, further comprising: a thin film pattern that is on a side of an edge area of each pixel defining pattern away from the base substrate, extends from the edge area to an area where the groove structure of the pixel defining pattern is located and covers a portion of an opening of the groove structure, the edge area being an area of the pixel defining pattern except the area where the groove structure is located,
   wherein the thin film pattern is on a side of the second portion of the organic light emitting layer close to the base substrate.

7. The OLED substrate of claim 6, wherein the first portion of the organic light emitting layer extends to the area where the groove structure of the pixel defining pattern is located, and covers the portion of the opening of the groove structure.

8. The OLED substrate of claim 6, wherein the edge area of the pixel defining pattern at both sides of the groove structure is provided with the thin film pattern, and the thin film pattern at both sides of the groove structure each cover a portion of the opening of the groove structure.

9. The OLED substrate of claim 1, further comprising a plurality of first electrodes, each of the plurality of sub-pixel units being provided with a respective one of the plurality of first electrodes therein, and the plurality of first electrodes being on a side of the organic light emitting layer close to the base substrate.

10. The OLED substrate of claim 1, wherein second electrode covers cover the filling layer and the organic light emitting layer.

11. The OLED substrate of claim 1, wherein the sub-pixel units comprise at least one of red sub-pixels, green sub-pixels, and blue sub-pixels.

12. The OLED substrate of claim 1, wherein the organic light emitting layer comprises a hole injection layer, a hole transport layer, an electron barrier layer, a hole barrier layer, an electron transport layer, and an electron injection layer.

13. A display device, comprising an OLED substrate, wherein the OLED substrate is the OLED substrate of claim 1.

* * * * *